United States Patent
Chung et al.

(10) Patent No.: US 8,093,116 B2
(45) Date of Patent: *Jan. 10, 2012

(54) METHOD FOR N/P PATTERNING IN A GATE LAST PROCESS

(75) Inventors: Sheng-Chen Chung, Jhubei (TW); Kong-Beng Thei, Hsin-Chu County (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 319 days.

This patent is subject to a terminal disclaimer.

(21) Appl. No.: 12/364,384

(22) Filed: Feb. 2, 2009

(65) Prior Publication Data

US 2010/0087038 A1   Apr. 8, 2010

Related U.S. Application Data

(60) Provisional application No. 61/102,966, filed on Oct. 6, 2008.

(51) Int. Cl.
*H01L 21/338* (2006.01)

(52) U.S. Cl. . 438/183; 438/199; 438/692; 257/E21.023; 257/E21.409; 257/E21.632; 257/E21.635

(58) Field of Classification Search .................. 438/199, 438/585; 257/E21.023, E21.409, E21.632, 257/E21.635

See application file for complete search history.

(56) References Cited

U.S. PATENT DOCUMENTS

| | | | |
|---|---|---|---|
| 6,333,540 B1 * | 12/2001 | Shiozawa et al. | 257/351 |
| 6,444,512 B1 | 9/2002 | Madhukar et al. | |
| 6,841,441 B2 | 1/2005 | Ang et al. | |
| 6,849,511 B2 * | 2/2005 | Iriyama et al. | 438/275 |
| 6,881,631 B2 * | 4/2005 | Saito et al. | 438/283 |
| 6,921,711 B2 | 7/2005 | Cabral, Jr. et al. | |
| 7,138,323 B2 | 11/2006 | Kavalieros et al. | |
| 7,476,582 B2 * | 1/2009 | Nakagawa et al. | 438/201 |
| 2002/0037615 A1 * | 3/2002 | Matsuo | 438/241 |
| 2002/0043683 A1 * | 4/2002 | Nakagawa et al. | 257/315 |
| 2005/0148137 A1 | 7/2005 | Brask et al. | |
| 2008/0001188 A1 * | 1/2008 | Cheng et al. | 257/288 |
| 2008/0023774 A1 * | 1/2008 | Sato et al. | 257/384 |
| 2010/0038692 A1 * | 2/2010 | Chuang et al. | 257/298 |
| 2010/0048013 A1 * | 2/2010 | Thei et al. | 438/591 |
| 2010/0087055 A1 * | 4/2010 | Lai et al. | 438/585 |
| 2011/0059601 A1 * | 3/2011 | Yeh et al. | 438/589 |

* cited by examiner

*Primary Examiner* — Jarrett Stark
(74) *Attorney, Agent, or Firm* — Haynes and Boone, LLP (57) ABSTRACT

A method is provided that includes providing a substrate, forming a first gate structure in a first region and a second gate structure in a second region, the first and second gate structures each including a high-k dielectric layer, a silicon layer, and a hard mask layer, where the silicon layer of the first gate structure has a different thickness than the silicon layer of the second gate structure, forming an interlayer dielectric (ILD) over the first and second gate structures, performing a chemical mechanical polishing (CMP) on the ILD, removing the silicon layer from the first gate structure thereby forming a first trench, forming a first metal layer to fill in the first trench, removing the hard mask layer and the silicon layer from the second gate structure thereby forming a second trench, and forming a second metal layer to fill in the second trench.

20 Claims, 11 Drawing Sheets

METHOD FOR N/P PATTERNING IN A GATE LAST PROCESS

PRIORITY DATA

This application claims priority to Provisional Application Ser. No. 61/102,966 filed on Oct. 6, 2008, entitled "Method For N/P Patterning In A Gate Last Process," the entire disclosure of which is incorporated herein by reference.

BACKGROUND

The present disclosure relates generally an integrated circuit device and, more particularly, to method for N/P patterning in a gate last process.

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed "gate last" process in which the final gate stack is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high dielectric constant (high-k) gate insulator layers are also used which allow greater physical thicknesses while maintaining the same effective thickness as would be provided by a typical gate oxide used in larger technology nodes.

There are challenges to implementing such features and processes in CMOS fabrication however. As the gate lengths decrease, these problems are exacerbated. For example, in a "gate last" fabrication process, N/P patterning to form metal gate structures is challenging and complex since different work function metal layers are formed in the respective nMOS and pMOS devices. Accordingly, the process may require patterning a photoresist layer to protect regions of one type of device to form a metal gate in regions of the other type of device, and vice versa.

Therefore, what is needed is a new and improved metal gate structure and device and method of gate formation.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to forming an integrated circuit device on a substrate and, more particularly, to fabricating a gate structure as part of an integrated circuit (including FET devices). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however one skilled in the art may recognize applicability to other processes and/or use of other materials.

Figure 1:
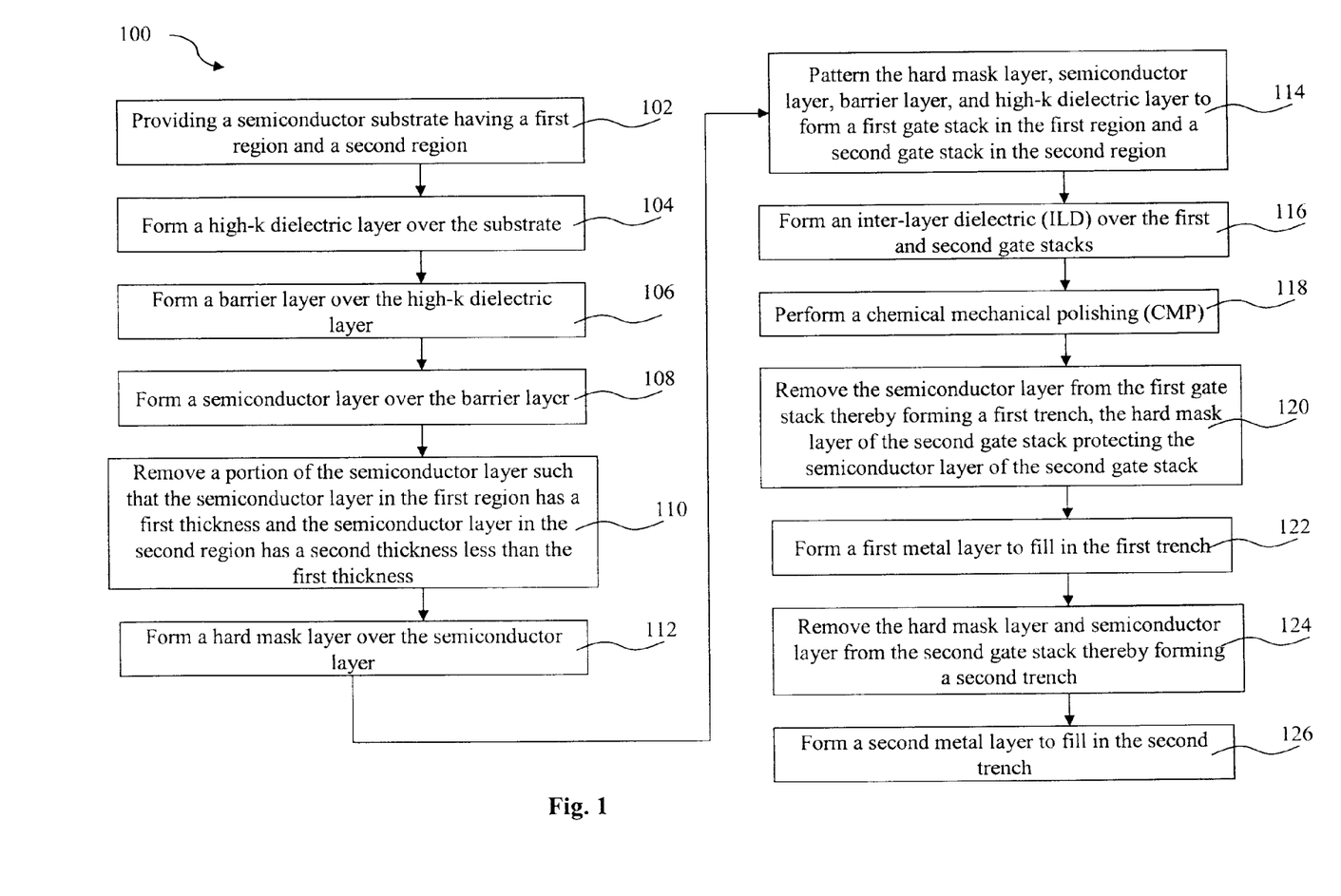
FIG. 1 is a flowchart of a method for fabricating a semiconductor device in a gate last process according to various aspects of the present disclosure.

Referring to FIG. 1, illustrated is a flowchart of a method 100 for fabricating a semiconductor device in a "gate last" process. Referring also to FIGS. 2A to 2J illustrated are cross-sectional views of a semiconductor device 200 at various stages of fabrication in a gate last process according to the method 100 of FIG. 1. The semiconductor device 200 may be an integrated circuit, or portion thereof, that may comprise static random access memory (SRAM) and/or other logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor device 200 may be fabricated with a CMOS process flow. Accordingly, it is understood that additional processes may be provided before, during, and after the method 100 of FIG. 1, and that some other processes may only be briefly described herein.

Figure 2A:
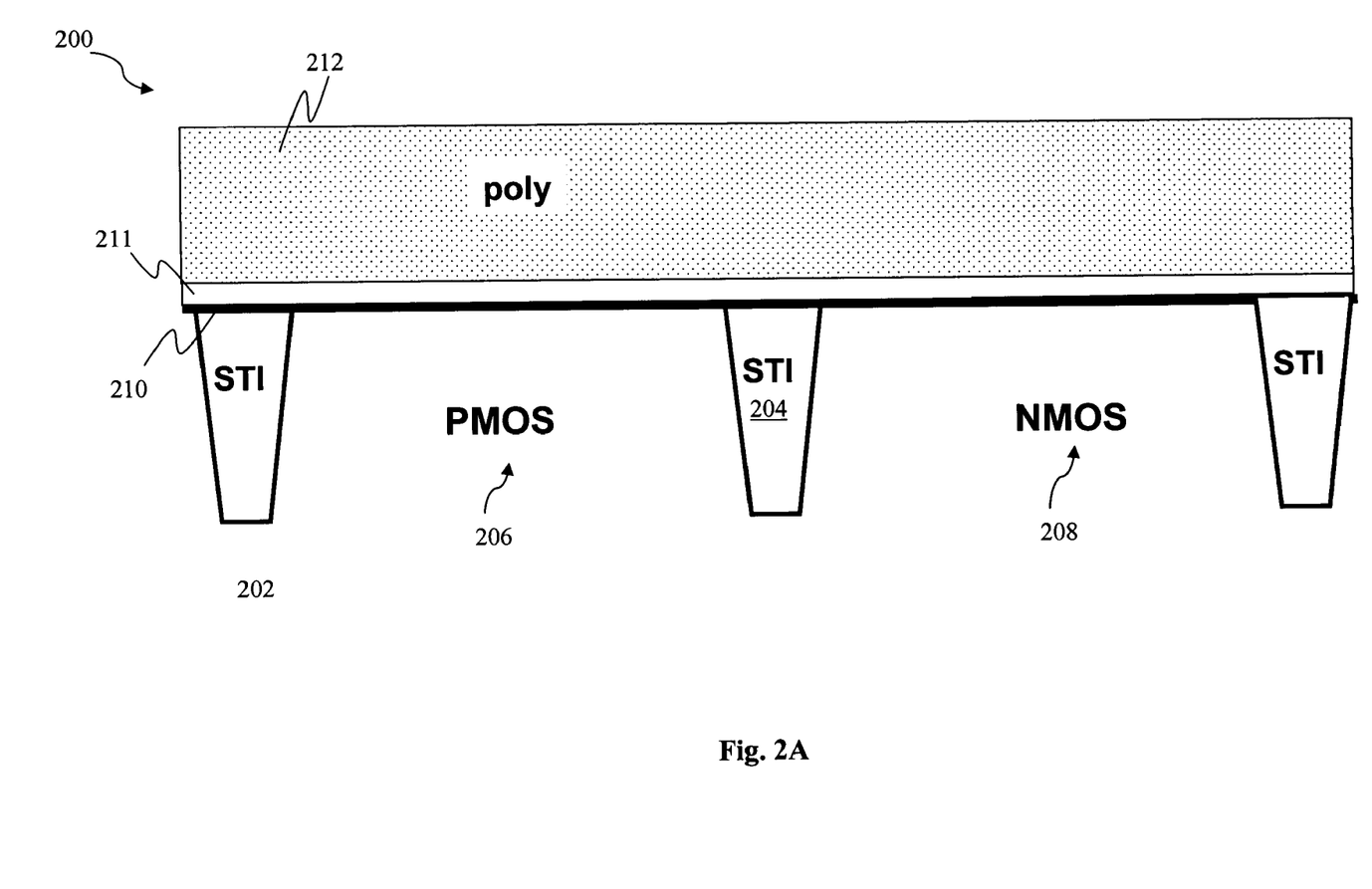
FIGS. 2A to 2J are cross-sectional views of a semiconductor device at various stages of fabrication according to the method of FIG. 1.

The method 100 begins with block 102 in which a semiconductor substrate may be provided, the substrate having a first region and a second region. In FIG. 2A, the semiconductor device 200 may include a substrate 202. In the present embodiment, the substrate 202 includes a silicon substrate (e.g., wafer) in crystalline structure. The substrate 202 may include various doping configurations depending on design requirements as is known in the art (e.g., p-type substrate or n-type substrate) Additionally, the substrate 202 may include various doped regions such as p-type wells (p-wells) or n-type wells (n-wells). Other examples of the substrate 202 may also include other elementary semiconductors such as germanium and diamond. Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and/or may include a silicon-on-insulator (SOI) structure.

The semiconductor device 200 may include isolation structures such as shallow trench isolation (STI) features 204 formed in the substrate 202 to isolate one or more devices from each other. In the present embodiment, the STI feature 204 may isolate an pMOS device 206 and a nMOS device 208. The STI features 204 may include silicon oxide, silicon nitride, silicon oxynitride, fluoride-doped silicate glass (FSG), and/or a low k dielectric material. Other isolation methods and/or features are possible in lieu of or in addition to STI. The STI features 204 may be formed using processes such as reactive ion etch (RIE) of the substrate 202 to form trenches which are then filled with an insulator material using deposition processes followed by a CMP process.

The method 100 continues with block 104 in a high-k dielectric layer may be formed over the semiconductor substrate. The semiconductor device 200 may include a gate dielectric 210 formed over the substrate. The gate dielectric 210 may include an interfacial layer. The interfacial layer may include a silicon oxide layer (e.g., thermal or chemical oxide formation) having a thickness ranging from about 5 to about 10 angstrom (A). The gate dielectric 210 may further include a high dielectric constant (high-k) material layer formed on the interfacial layer. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The high-k dielectric layer may be formed by atomic layer deposition (ALD) or other suitable technique. The high-k dielectric layer may include a thickness ranging from about 10 to about 30 angstrom (A).

The method 100 continues with block 106 in which a barrier layer may be formed over the high-k dielectric layer. In some embodiments, a barrier layer 211 may be formed over the high-k dielectric layer. The barrier layer 211 may include TiN or TaN having a thickness ranging from about 10 to about 50 angstrom (A). Alternatively, the barrier layer may optionally include $Si_3N_4$. The barrier layer 212 may be formed by various deposition techniques such as ALD, physical vapor deposition (PVD or sputtering), chemical vapor deposition (CVD), or other suitable process.

The method 100 continues with block 108 in which a semiconductor layer may be formed over the barrier layer. The semiconductor device 200 may further include a polysilicon (or poly) layer 212 formed over the barrier layer 211 by CVD or other suitable deposition process. For example, silane ($SiH_4$) may be used as a chemical gas in the CVD process to form the poly layer 212. The poly layer 212 may include a thickness ranging from about 400 to about 800 angstrom (A). The semiconductor layer may alternatively include an amorphous silicon layer.

The method 100 continues with block 110 in which a portion of the semiconductor layer may be removed such that the semiconductor layer in the first region has a first thickness and the semiconductor layer in the second region has a second thickness less than the first thickness. Prior to gate patterning, the poly layer 212 may be partially etched in a region where one type of device (e.g., pMOS device 206 or nMOS 208) is to be formed. In the present embodiment, a portion of the poly layer 212 in the region of the nMOS device 208 side may be etched by a dry etch or wet etch process.

Figure 2B:
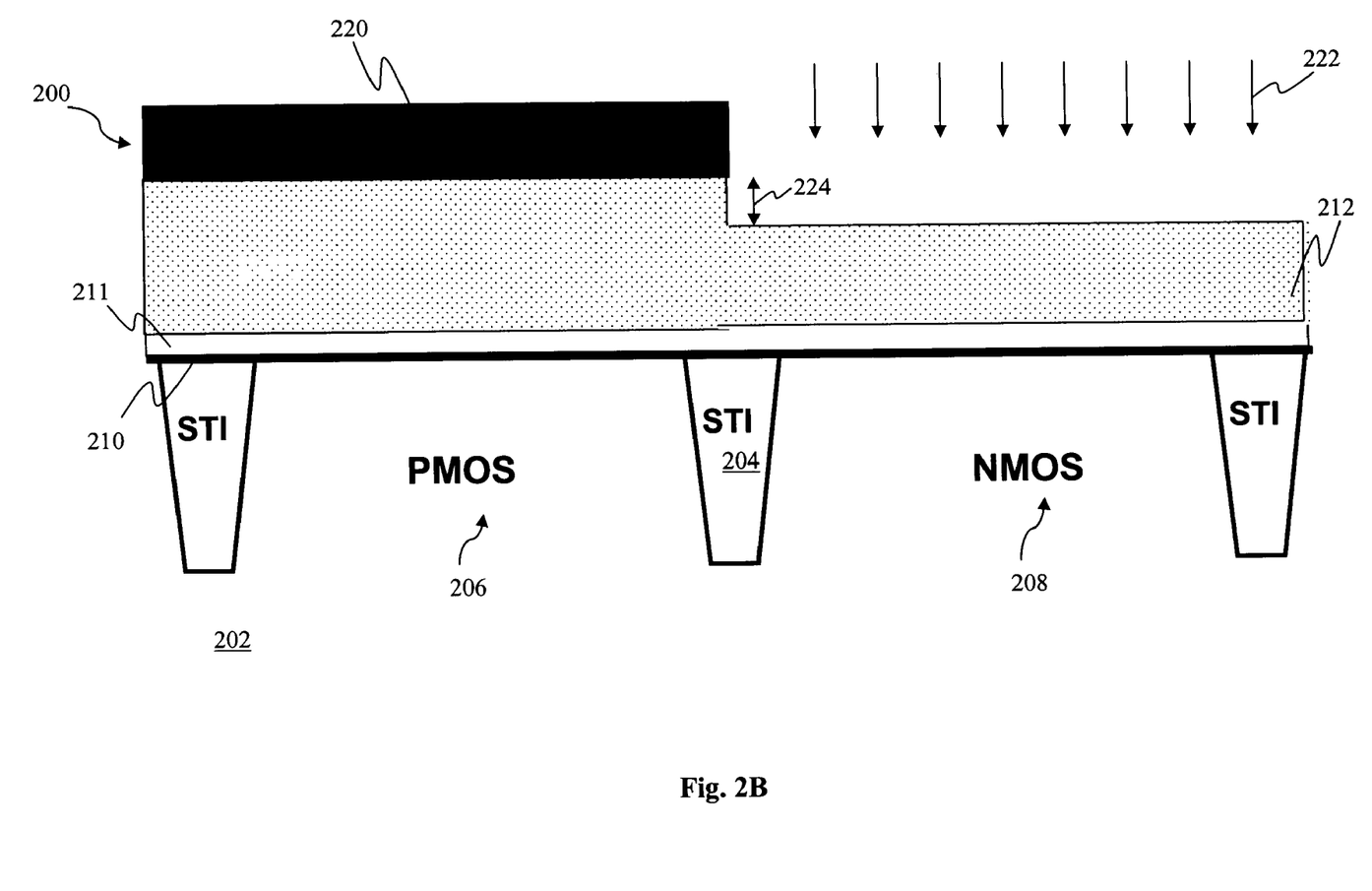

In FIG. 2B, a patterned photoresist layer 220 may be formed to protect the poly layer 212 in the pMOS device 206 side. The patterned photoresist layer may be formed by photolithography, immersion lithography, ion-beam writing, or other suitable patterning process. The unprotected poly layer 212 in the nMOS device 208 side may be etched 222 by a dry etch process (e.g., plasma) using an ambient of chlorine-containing gases or other suitable gases. Alternatively, a wet etch process may be optionally be used that includes exposure to a hydroxide containing solution (e.g., ammonium hydroxide), deionized water, and/or other suitable etchant solutions. The desired thickness of the poly layer 212 in the nMOS device 208 side may be achieved by precisely controlling the etching time of the etch process. In the present embodiment, a thickness 224 of the poly layer 212 in the nMOS device 208 side that is removed ranges from about 300 to about 400 angstrom (A). The patterned photoresist layer 220 may then be removed by stripping or other suitable technique.

Figure 2C:
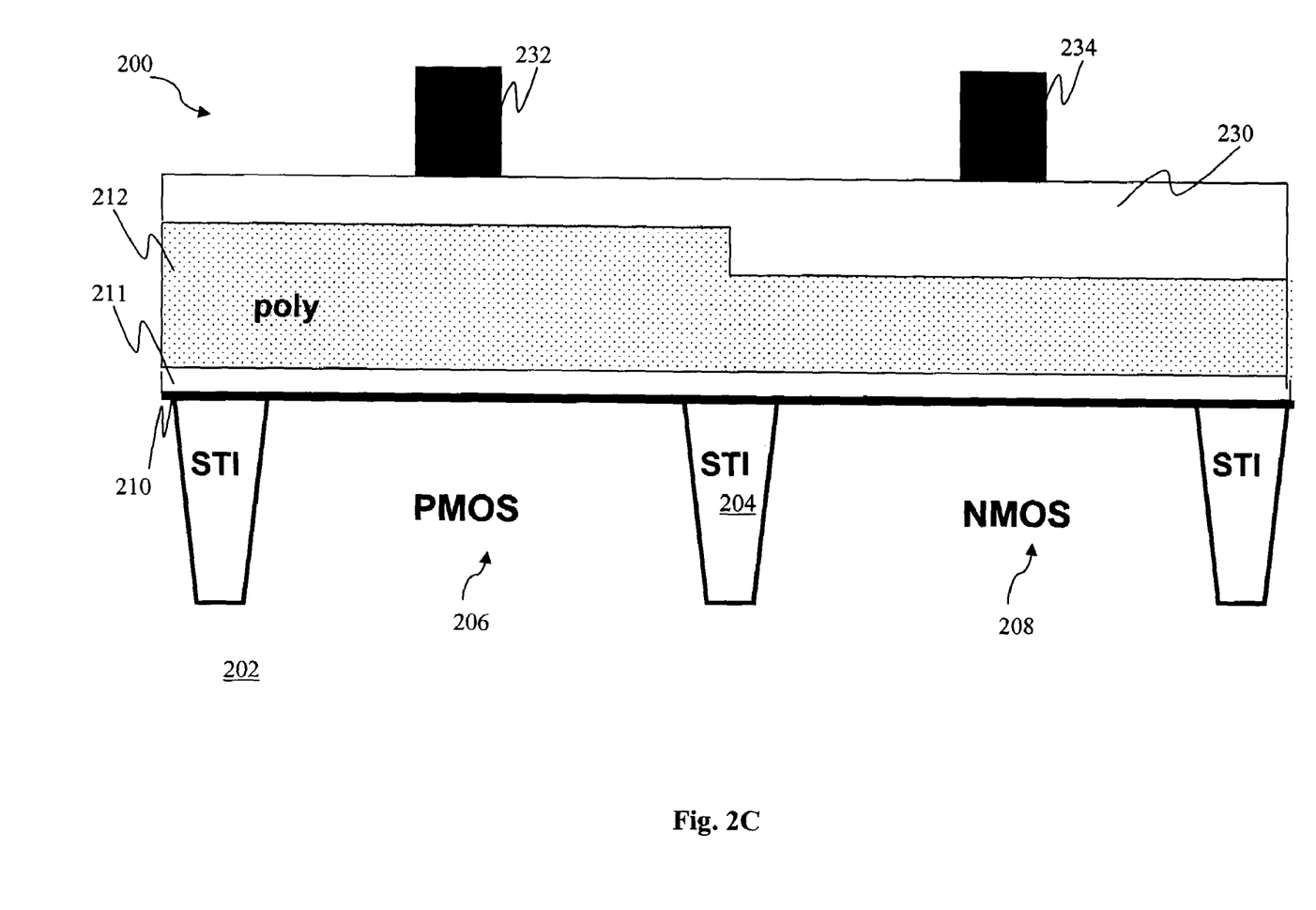

The method 100 continues with block 112 in which a hard mask layer may be formed over the semiconductor layer. In FIG. 2C, a hard mask layer 230 may be formed over the partially etched poly layer 212. The hard mask layer 230 may include silicon oxide, silicon nitride, silicon oxynitride, and/or other suitable materials. The hard mask layer 230 may be formed using methods such as CVD, PVD, or ALD. Additionally, an anti-reflective coating (ARC) layer or bottom anti-reflective coating (BARC) layer may be formed on the hard mask layer 230 to enhance a subsequent patterning process as is known in the art. A patterned photoresist layer may be formed on the hard mask layer 230. The patterned photoresist layer may include a gate pattern 232 for the pMOS device 206 and a gate pattern 234 for the nMOS device 208. The gate patterns 232, 234 may be formed by photolithography, immersion lithography, ion-beam writing, or other suitable process.

Figure 2D:
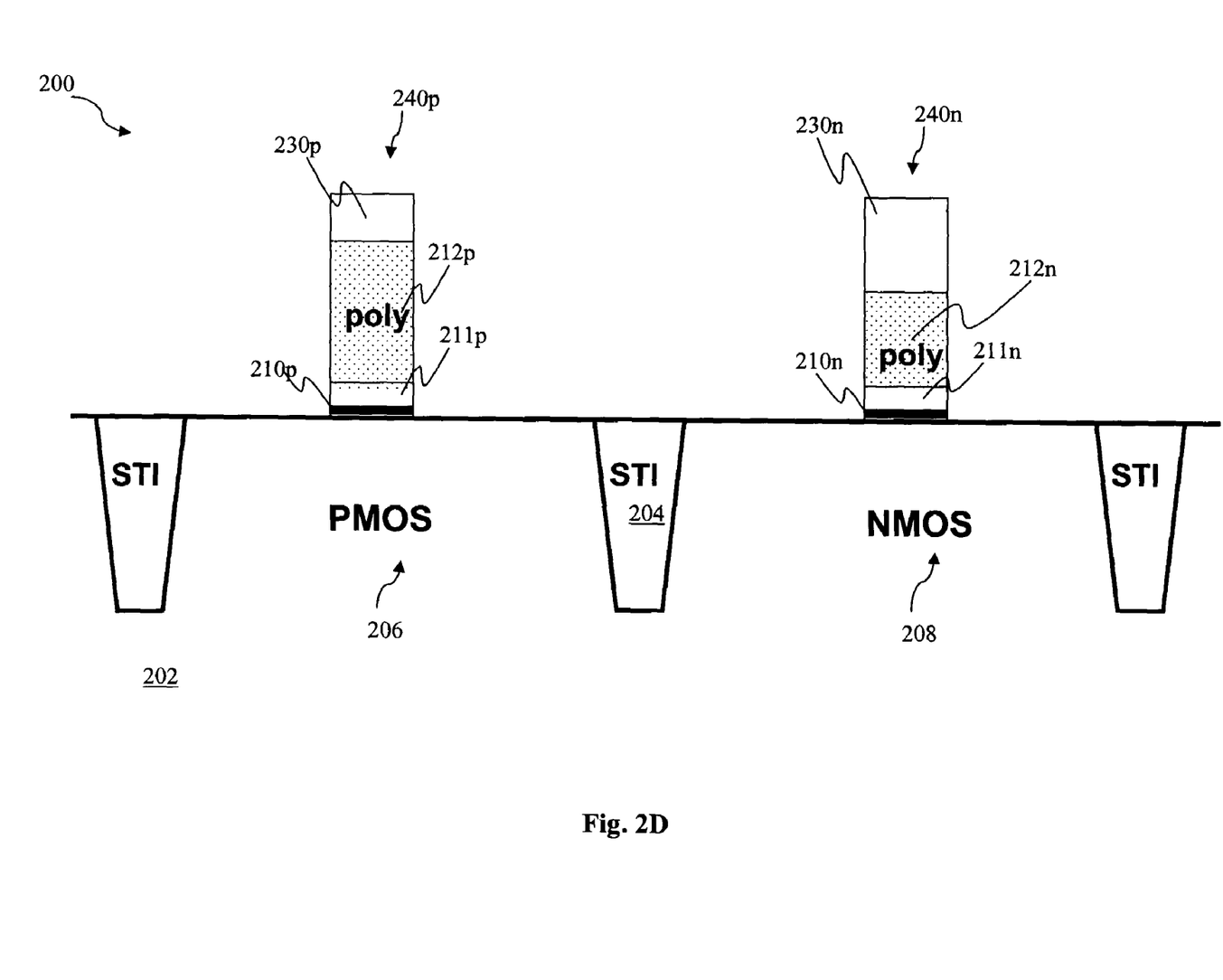

The method 100 continues with block 114 in which the hard mask layer, semiconductor layer, barrier layer, and high-k dielectric layer may be patterned to form a first gate stack in the first region and a second gate stack in the second region. In FIG. 2D, the hard mask layer 230 may be patterned by a dry or wet etching process using the patterned photoresist 232, 234 as a mask, and the patterned hard mask layer may be used to pattern a gate structure 240p for the pMOS device 206 and a gate structure 240n for the nMOS device 208. The gate structures 240p, 240n may be formed by a dry etching or wet etching or combination dry and wet etching process (e.g., gate etching or patterning). For example, the dry etching process may use a fluorine-containing plasma (e.g., etch gas includes $CF_4$). Alternatively, the etching process may include multiple etching steps to etch the various gate material layers. The patterned photoresist layer 232, 234 may be removed by a stripping or other suitable technique.

The gate structure 240p of the pMOS device 206 may include a hard mask layer 230p, a dummy poly gate 212p, a barrier layer 211p, and a gate dielectric layer 210p (including an interfacial layer and high-k dielectric layer). The gate structure 240n of the nMOS device 208 may include a hard mask layer 230n, a dummy poly gate 212n, a barrier layer 211n, and a gate dielectric layer 210n (including an interfacial layer and high-k dielectric layer). It should be noted that the thickness of the dummy poly gate 216n in the nMOS device 208 is less than the thickness of the dummy poly gate 212p in the pMOS device 206. Accordingly, the thickness of the hard mask layer 214n in the nMOS device 208 side is greater than the thickness of the hard mask layer 214p in the pMOS device 206 side. Thus, N/P patterning in a gate last flow to form different metal gates (e.g., work function metal) for the pMOS device 206 and the nMOS device 208, respectively, becomes less difficult with the different dummy poly gate thicknesses as will be discussed below.

Figure 2E:
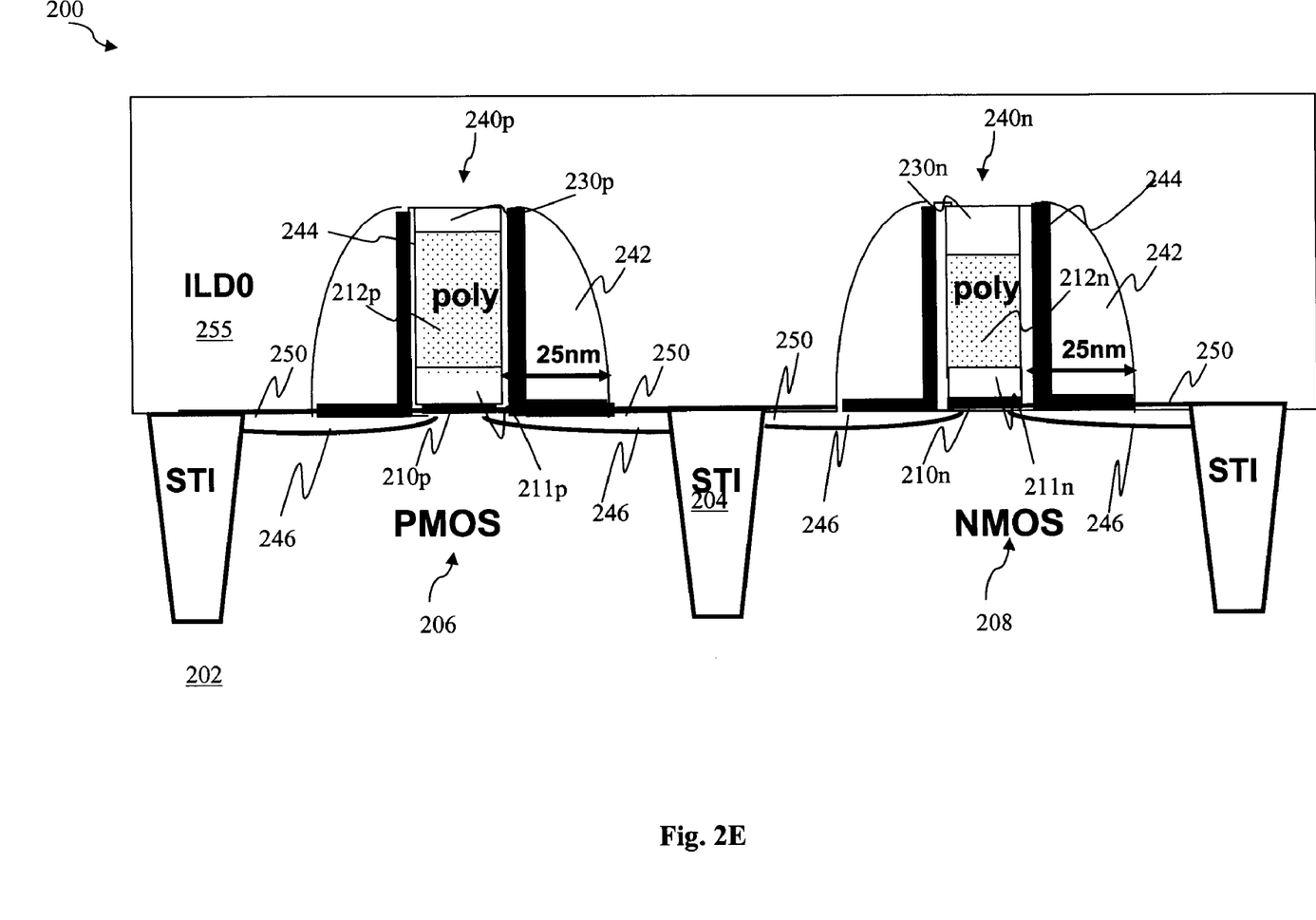

In FIG. 2E, after gate patterning (block 114 of FIG. 1), it is understood that the semiconductor device 200 may undergo further processing in a CMOS process flow to form various features as is known in the art. For example, gate or sidewall spacers 242 may be formed on both sidewalls of the gate structures 240p, 240n. The spacers 242 may be formed of silicon oxide, silicon nitride, silicon oxynitride, silicon carbide, fluoride-doped silicate glass (FSG), a low k dielectric material, combinations thereof, and/or other suitable material. The spacers 242 may include a multi-layer configuration. The spacers 242 may be formed by methods including deposition of suitable dielectric material and anisotropically etching the material to form the spacer 242 profile. A liner layer 244 may be formed on the sidewalls of the gate structures 240p, 240n prior to forming the spacers 242. The liner layer 244 may include a dielectric material such as silicon oxide, silicon nitride, and/or other suitable materials.

Also, source/drain (S/D) regions 246 may be formed in the substrate 202. The S/D regions 246 may include lightly doped source/drain regions (LDD) and heavy doped source/drain regions. It should be noted that the LDD regions may be formed prior to formation of the spacers 242. The S/D regions 246 may be formed by implanting p-type or n-type dopants or impurities into the substrate 202 depending on the desired transistor configuration (e.g., pMOS or nMOS). The S/D regions 246 may be formed by methods including photolithography, ion implantation, diffusion, and/or other suitable processes. An annealing process is performed thereafter to activate the S/D regions 246. The annealing process can be implemented by a suitable method, such as rapid thermal annealing (RTA) or laser annealing. Further, the S/D regions 246 of the pMOS device 206 may include raised S/D regions with SiGe features. For example, the SiGe features may be formed by an epitaxy process such that the SiGe features can be formed in a crystalline state in the substrate 202. Thus, a strained channel may be achieved in the pMOS device 208 to increase carrier mobility and enhance device performance.

Further, contact features 250 such as silicide may be formed and coupled to the S/D regions 246. The contact features 250 may be formed on the S/D regions 246 by a salicide (self-aligned silicide) process. For example, a metal material may formed next to silicon structures, then the temperature is raised to anneal and cause a reaction between the underlying silicon and metal material to form silicide, and the un-reacted metal may be etched away. The contacts 250 may include nickel silicide, cobalt silicide, tungsten silicide, tantalum silicide, titanium silicide, platinum silicide, erbium silicide, palladium silicide, or combinations thereof. It should be noted that the hard mask layers 230p, 230n protect the dummy poly layers 212p, 212n, respectively, from the salicide process.

A contact etch stop layer (CESL) may be formed of silicon nitride, silicon oxynitride, and/or other suitable materials. The CESL composition may be selected based upon etching selectivity to one or more additional features of the semiconductor device 200. Further, the CESL may be configured as a tensile-CESL or a compressive-CESL depending on the desired transistor type.

The method 100 continues with block 116 in which an inter-layer dielectric (ILD) may be formed over the first gate stack and the second gate stack. A dielectric layer 255 such as an inter-layer (or level) dielectric (ILD) layer may be formed overlying the gate structures 240p, 240n including the CESL. The dielectric layer 255 may be formed by chemical vapor deposition (CVD), high density plasma CVD, spin-on, sputtering, or other suitable methods. The dielectric layer 255 may include silicon oxide, silicon oxynitride, or a low k material. In an embodiment, the dielectric layer 255 includes a high density plasma (HDP) dielectric and a high aspect ratio process (HARP) dielectric for gap filling between the devices 206, 208.

Figure 2F:
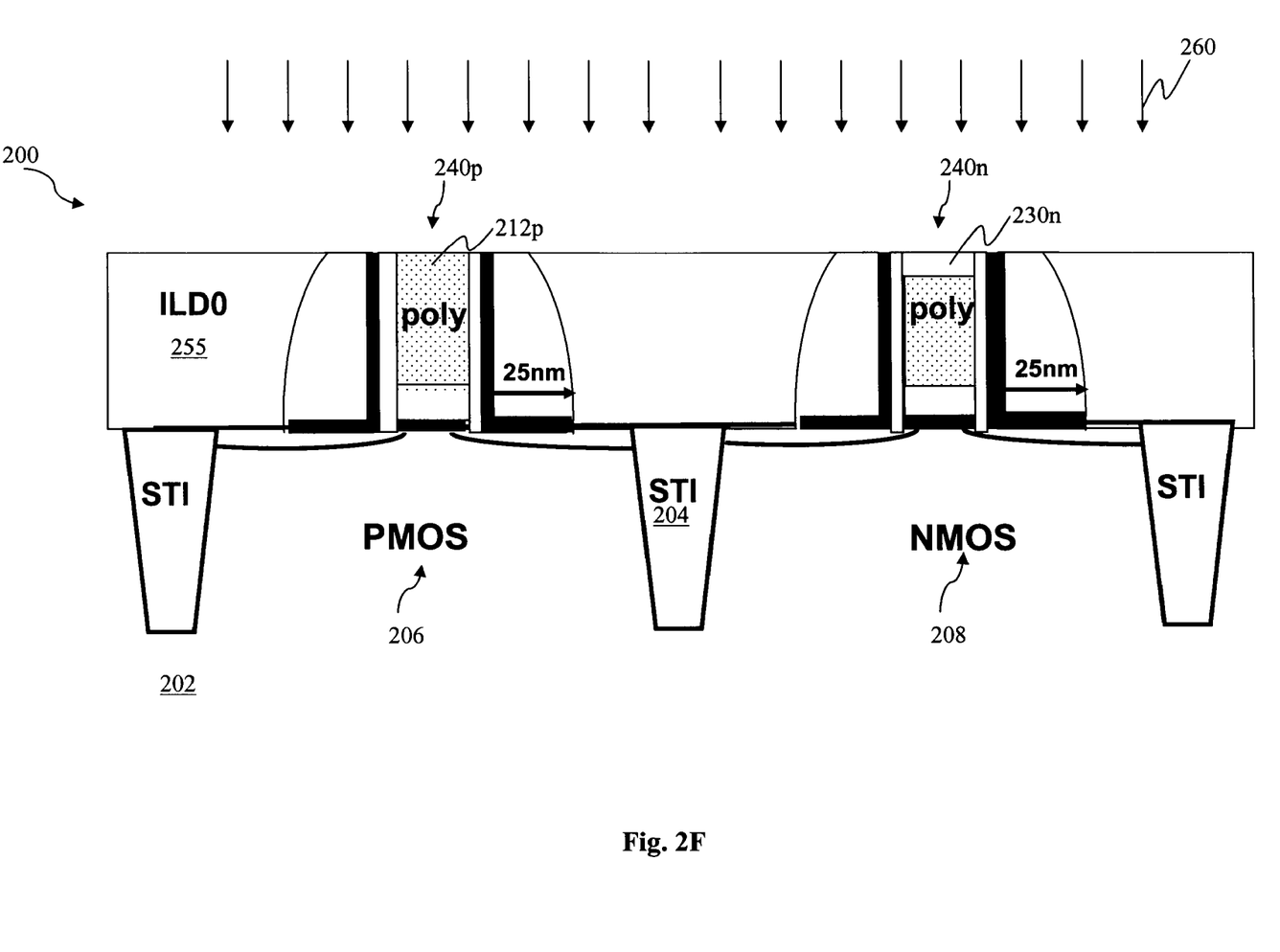

The method 100 continues with block 118 in which a chemical mechanical polishing (CMP) may be performed on the ILD. In FIG. 2F, in a gate last process, the dummy poly gates 212p, 212n may be removed so that a resulting metal gate structure may be formed in place of the dummy poly gates. Accordingly, the dielectric layer 255 may be planarized by a chemical mechanical polishing (CMP) process 260 until a top portion of the dummy poly gate 212p in the pMOS device 206 side is reached or exposed. Because of the different thicknesses of the dummy poly gates 212p and 212n, a portion of the hard mask layer 230n in the nMOS device 208 side still remains following the CMP process 260. Accordingly, the dummy poly gate 212n in the nMOS device 208 side is not exposed following the CMP process 260.

Figure 2G:
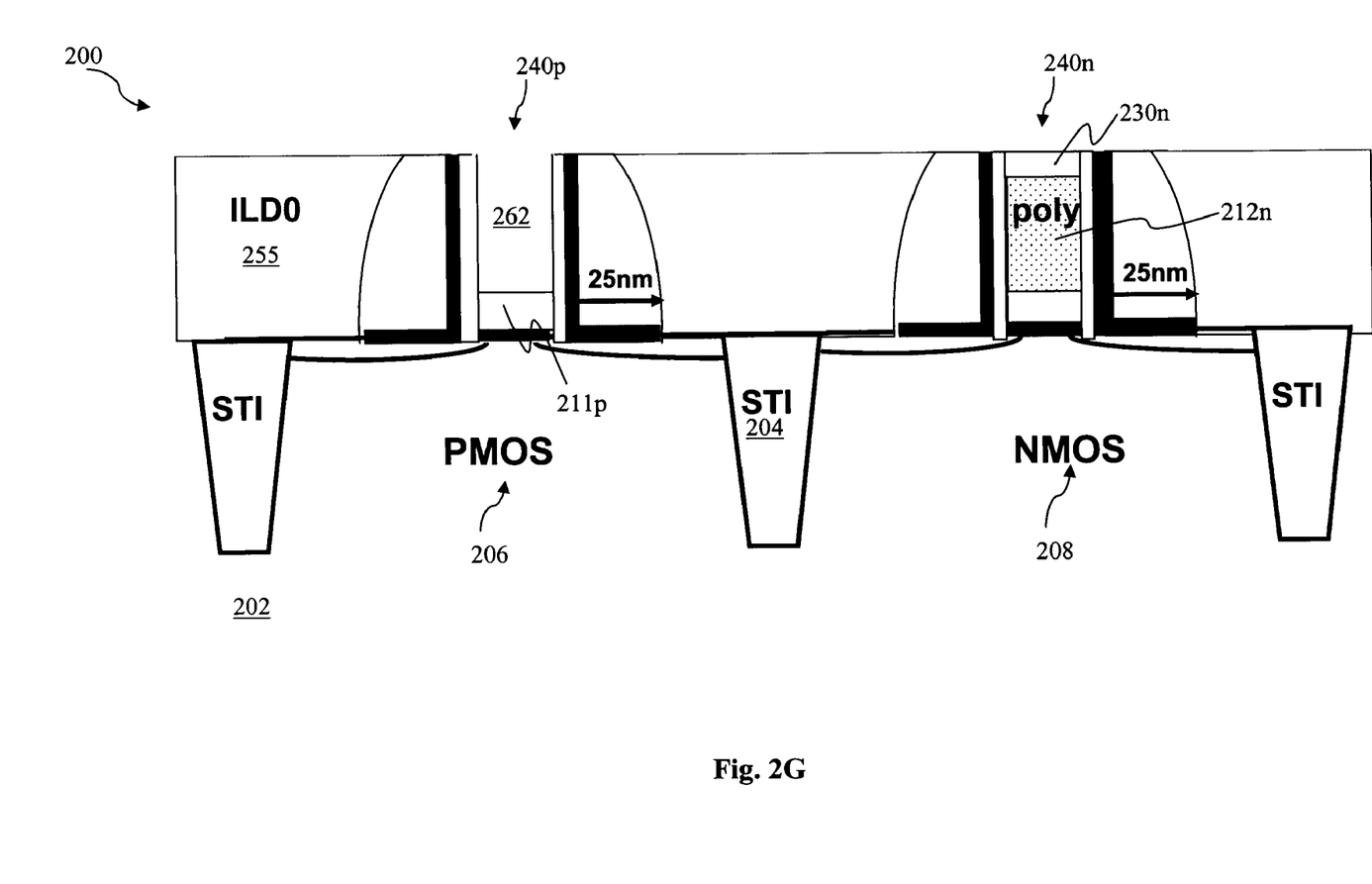

The method 100 continues with block 118 in which the semiconductor layer in the first gate stack may be removed thereby forming a first trench. In FIG. 2G, following the CMP process 260, the dummy poly gate 212p in the gate structure 240p may be removed. For example, polysilicon is selectively etched removing the dummy poly gate 212p from the gate structure 240p. The selective removal of the dummy gate structure 212p provides a trench 262 within which a metal gate may be formed. The dummy poly gate 212p may be removed using a wet etch and/or a dry etch. In an embodiment, a wet etch process includes exposure to a hydroxide containing solution (e.g., ammonium hydroxide), deionized water, and/or other suitable etchant solutions. It should be noted that the dummy poly gate 212n in the nMOS device 208 side is not removed since the remaining portion of the hard mask layer 230n protects the underlying dummy poly gate 212n from being removed. Accordingly, this configuration provides a structure for N/P patterning without having to separately pattern a photoresist layer to protect one type of device to form a metal gate for the other type of device, and vice versa. Thus, the N/P patterning process is greatly simplified in the gate last process.

Figure 2H:
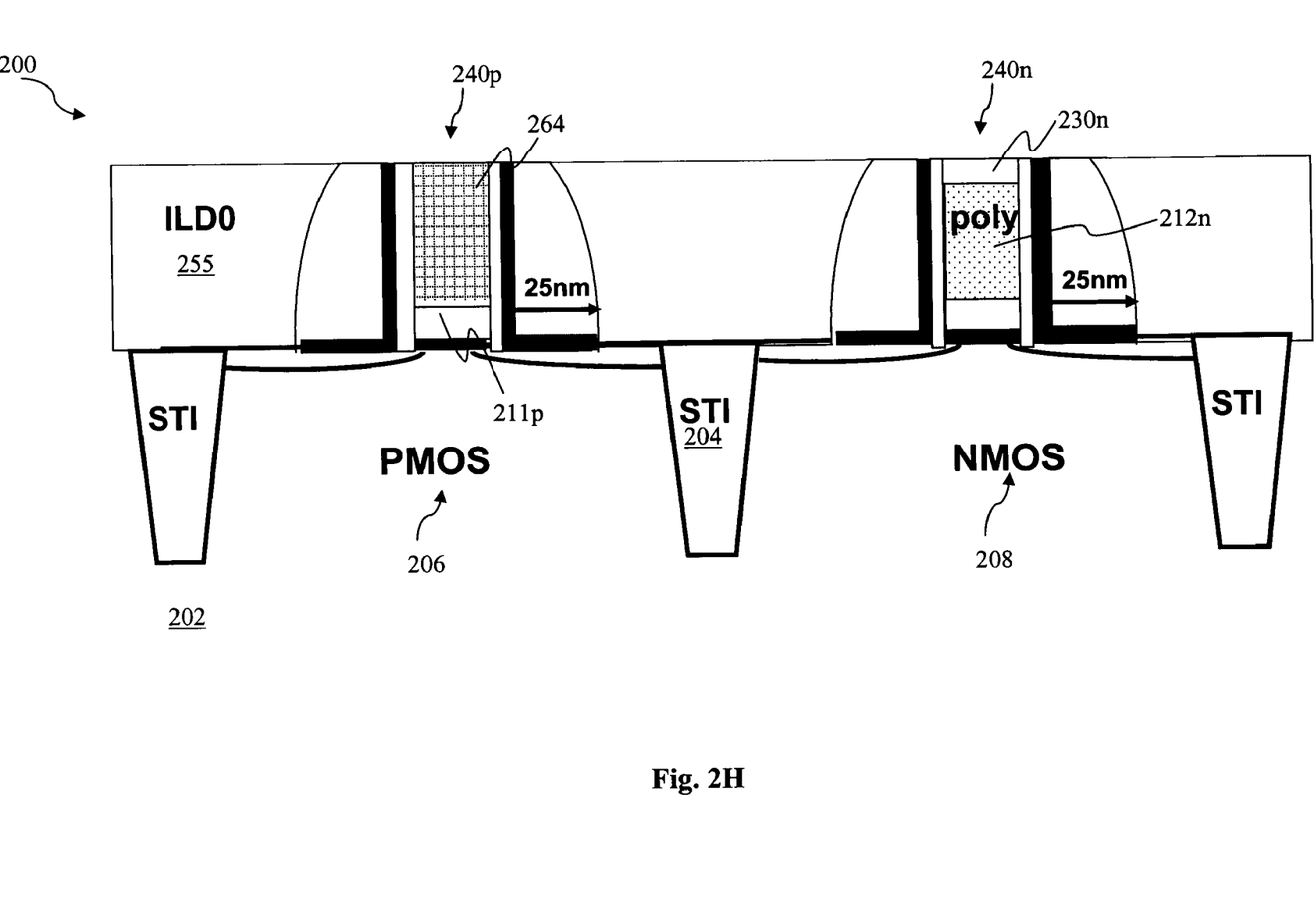

The method 100 continues with block 120 in which a first metal layer may be formed to substantially fill in the first trench. In FIG. 2H, a metal layer 264 may be deposited to fill in the trench 262. The metal layer 264 may include any metal material suitable for forming a metal gate or portion thereof, including work function layers, liner layers, interface layers, seed layers, adhesion layers, barrier layers, etc. The metal layer 264 may be formed by PVD or other suitable processes. The metal layer 264 may include a P-type work function metal (P-metal) that provides a gate electrode that properly performs in the pMOS device 206. P-metal materials include TiN, WN, TaN, conductive metal oxides, and/or other suitable materials. The metal layer 264 may further include a fill metal layer formed on the work function metal layer. The fill metal layer may include aluminum (Al) or tungsten (W), or other suitable materials. In an embodiment, the fill metal may include a Ti layer that functions as a wetting layer and an Al layer to fill in the remainder of the trench. The fill metal layer may be deposited using CVD, PVD, plating, or other suitable process. A CMP process may be performed to planarize the semiconductor device 200. The CMP process may remove the metal layer 264 outside of the trench 262 and provides the semiconductor device 200 with a P-metal gate structure.

Figure 2I:
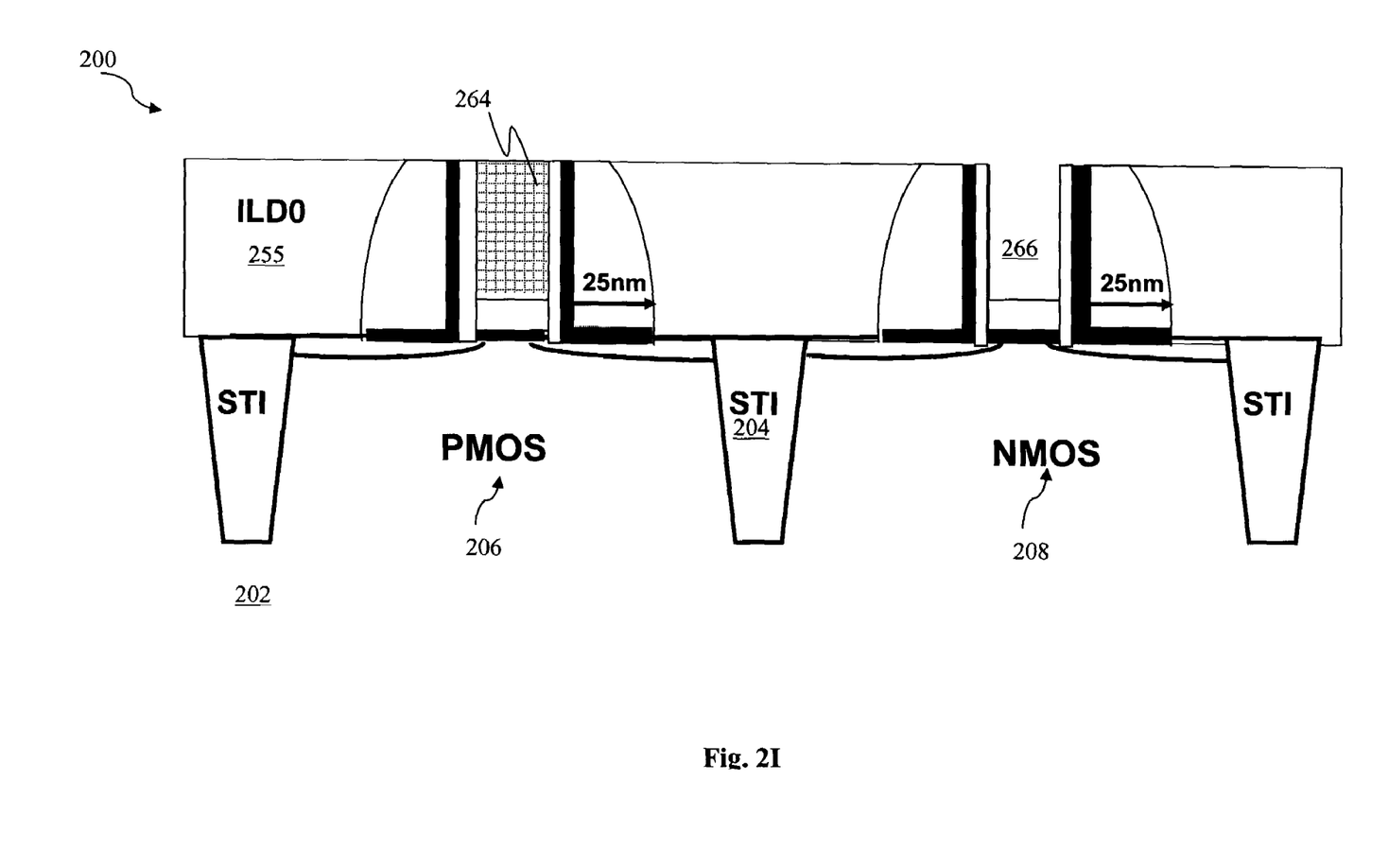

The method 100 continues with block 122 in which the hard mask layer and semiconductor layer may be removed from the second gate stack thereby forming a second trench. In FIG. 2I, the remaining hard mask layer 230n and the dummy poly gate 212n may be removed from the gate structure 240n by a dry or wet or combination dry and wet etch process. For example, the hard mask layer 230n may be removed by a wet etch dip that selectively removes the hard mask layer without removing the polysilicon. The dummy poly gate 212n may then be removed by a similar process discussed above for removing the dummy poly gate 212p in the pMOS device 206. Alternatively, the hard mask layer 230n and dummy poly gate 212n may optionally be removed in the same etch process that stops at the barrier layer 211n. The selective removal of the hard mask layer 230n and dummy gate structure 212n provides a trench 266 within which a metal gate may be formed.

Figure 2J:
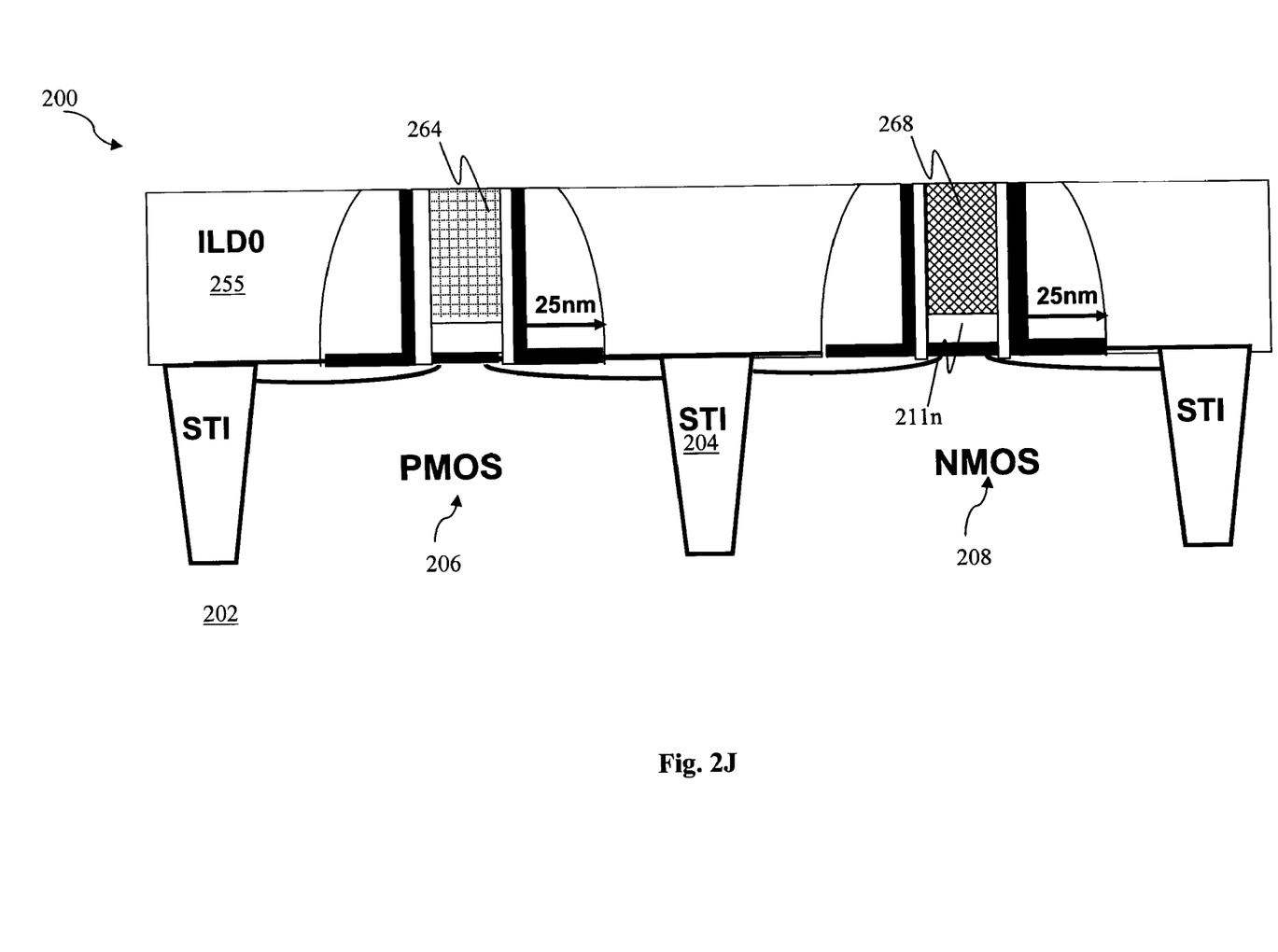

The method 100 continues with block 124 in which a second metal layer may be formed to fill in the second trench. In FIG. 2J, a metal layer 268 may be deposited to fill in the trench 266. The metal layer 268 may include any metal material suitable for forming a metal gate or portion thereof, including work function layers, liner layers, interface layers, seed layers, adhesion layers, barrier layers, etc. The metal layer 268 may be formed by PVD or other suitable processes. The metal layer may include a N-type work function metal (N-metal) to provide a gate electrode that properly performs in the nMOS device 208. N-type metal materials may include compositions such as TiAl, TAlN, other aluminides, and/or other suitable materials. The metal layer 268 may further include a fill metal layer formed on the work function metal layer. The fill metal layer may include aluminum (Al) or tungsten (W), or other suitable materials. In an embodiment, the fill metal may include a Ti layer that functions as a wetting layer and an Al layer to fill in the remainder of the trench. The fill metal layer may be deposited using CVD, PVD, plating, or other suitable process. A CMP process may be performed to planarize the semiconductor device 200. The CMP process may remove the metal layer 268 outside of the trench 266 and provides the semiconductor device 200 with an N-metal gate structure.

In embodiments, the method 100 may continue to include additional process steps such as deposition of passivation layers, formation of contacts, interconnect structures (e.g., lines and vias, metal layers, and interlayer dielectric that provide electrical interconnection to the device including the formed metal gate). For example, a multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure.

In summary, a gate last process may be implemented to form metal gate structures. Problems with forming the metal gate structures for an nMOS and pMOS device in a gate last process may be addressed by providing different dummy poly gate thicknesses. In particular, the polysilicon layer is partially removed in a region of one type of device (e.g., nMOS or pMOS) prior to gate pattering/etching. Accordingly, a subsequent hard mask layer formed on the partially removed polysilicon layer will protect the dummy poly gate of one type of device during formation of a metal gate of the other type of device. Thus, the N/P patterning process to form metal gates in the nMOS and pMOS devices, respectively, is greatly simplified and can be implemented even as device features continue to shrink in advanced technology nodes (e.g., 45 nm and below). Further, control of the gate height is improved by the embodiments disclosed herein. It is understood that different embodiments disclosed herein offer several different advantages, and that no particular advantage is necessarily required for all embodiments.

Thus, provided is a method for fabricating a semiconductor device that includes providing a semiconductor substrate, forming a high-k dielectric layer over the substrate, forming a semiconductor layer over the high-k dielectric layer, removing a portion of the semiconductor layer such that the semiconductor layer in a first region has a first thickness and the semiconductor layer in a second region has a second thickness less than the first thickness, forming a hard mask layer over the semiconductor layer, patterning the hard mask layer, semiconductor layer, and high-k dielectric layer to form a first gate structure in the first region and a second gate structure in the second region, forming an interlayer dielectric (ILD) over the first and second gate structures, performing a first chemical mechanical polishing (CMP) on the ILD that substantially stops at the semiconductor layer of the first gate structure, removing the semiconductor layer from the first gate structure thereby forming a first trench, wherein the hard mask layer of the second gate structure protects the semiconductor layer of the second gate structure, forming a first metal layer to fill in the first trench, removing the hard mask layer and semiconductor layer from the second gate structure thereby forming a second trench, and forming a second metal layer to fill in the second trench.

Also provided is a method for fabricating a semiconductor device that includes providing a semiconductor substrate, forming a high-k dielectric layer over the substrate, forming a barrier layer over the high-k dielectric layer, forming a silicon layer over the barrier layer, partially etching the silicon layer such that the silicon layer in a first region has a first thickness and the silicon layer in a second region has a second thickness less than the first thickness, forming a hard mask layer over the partially etched silicon layer, forming a first gate structure in the first region and a second gate structure in the second region, the first gate structure including the silicon layer having the first thickness and the second gate structure including the silicon layer having the second thickness, forming an interlayer dielectric (ILD) over the first and second gate structures, performing a chemical mechanical polishing (CMP) on the ILD that substantially stops at the silicon layer of the first gate structure, the CMP removing a portion of the hard mask layer of the second gate structure, removing the silicon layer from the first gate structure thereby forming a first trench, forming a first metal layer to fill in the first trench, removing the remaining portion of the hard mask layer and the silicon layer from the second gate structure thereby forming a second trench, and forming a second metal layer to fill in the second trench.

Further, a method for fabricating a semiconductor device is provided that includes providing a semiconductor substrate having a first region and a second region, forming a first gate structure over the first region and a second gate structure over the second region, the first and second gate structures each including a high-k dielectric layer formed over the substrate, a silicon layer formed over the high-k dielectric layer, and a hard mask layer formed over the silicon layer, wherein the silicon layer of the first gate structure has a first thickness and the silicon layer of the second gate structure has a second thickness less than the first thickness, forming an interlayer dielectric (ILD) over the first and second gate structures, performing a chemical mechanical polishing (CMP) on the ILD that exposes the silicon layer of the first gate structure, removing the silicon layer from the first gate structure thereby forming a first trench, wherein the hard mask layer of the second gate structure protects the silicon layer of the second gate structure from being removed, forming a first metal layer to fill in the first trench, removing the hard mask layer and the silicon layer from the second gate structure thereby forming a second trench, and forming a second metal layer to fill in the second trench.

Accordingly, the present disclosure provides a device and method that includes a modified trench structure that prevents or reduces the risk of incomplete formation of a metal gate in a gate-last process. While the preceding description shows and describes one or more embodiments, it will be understood by those skilled in the art that various changes in form and detail may be made therein without departing from the spirit and scope of the present disclosure. For example, although the methods implements a "gate last" approach, the methods disclosed herein may be used in a hybrid process in which one type of metal gate is formed in a "gate first" process flow and the other type of metal gate is formed in a "gate last" process flow. Therefore, the claims should be interpreted in a broad manner, consistent with the present disclosure.

What is claimed is:

1. A method of fabricating a semiconductor device comprising:
   providing a semiconductor substrate;
   forming a high-k dielectric layer over the substrate;
   forming a semiconductor layer over the high-k dielectric layer;
   removing a portion of the semiconductor layer such that the semiconductor layer in a first region has a first thickness and the semiconductor layer in a second region has a second thickness less than the first thickness;
   forming a hard mask layer over the semiconductor layer;
   patterning the hard mask layer, semiconductor layer, and high-k dielectric layer to form a first gate structure in the first region and a second gate structure in the second region;
   forming an interlayer dielectric (ILD) over the first and second gate structures;
   performing a first chemical mechanical polishing (CMP) on the ILD that substantially stops at the semiconductor layer of the first gate structure;
   removing the semiconductor layer from the first gate structure thereby forming a first trench, wherein the hard mask layer of the second gate structure protects the semiconductor layer of the second gate structure;
   forming a first metal layer to fill in the first trench;
   removing the hard mask layer and semiconductor layer from the second gate structure thereby forming a second trench; and
   forming a second metal layer to fill in the second trench.

2. The method of claim 1, wherein the forming the first metal layer includes:
   depositing a first metal material over the substrate substantially filling in the first trench; and
   performing a second CMP to remove the first metal material outside of the first trench.

3. The method of claim 2, wherein the forming the second metal layer includes:
   depositing a second metal material over the substrate substantially filling in the second trench; and
   performing a third CMP to remove the second metal material outside of the second trench.

4. The method of claim 1, wherein the first metal layer includes a metal having a first type of work function.

5. The method of claim 4, wherein the second metal layer includes a metal having a second type of work function different from the first type of work function.

6. The method of claim 5, wherein the metal having the first type of work function is an N-metal and the first gate structure is part of an nMOS device; and
   wherein the metal having the second type of work function is a P-metal and the second gate structure is part of pMOS device.

7. The method of claim 5, wherein the metal having the first type of work function is an P-metal and the first gate structure is part of an pMOS device; and
   wherein the metal having the second type of work function is an N-metal and the second gate structure is part of nMOS device.

8. The method of claim 1, wherein the semiconductor layer includes a polysilicon.

9. The method of claim 1, further comprising:
   forming an interfacial layer on the substrate prior to forming the high-k dielectric layer; and
   forming a barrier layer on the high-k dielectric layer prior to forming the semiconductor layer;
   wherein the high-k dielectric layer is formed on the interfacial layer;
   wherein the semiconductor layer is formed on the barrier layer.

10. The method of claim 1, wherein the removing a portion of the semiconductor layer includes:
    forming a patterned photoresist layer to protect the semiconductor layer in the first region; and
    etching the unprotected semiconductor layer in the second region from the first thickness to the second thickness.

11. A method of fabricating a semiconductor device comprising:
    providing a semiconductor substrate;
    forming a high-k dielectric layer over the substrate;
    forming a barrier layer over the high-k dielectric layer;
    forming a silicon layer over the barrier layer;
    partially etching the silicon layer such that the silicon layer in a first region has a first thickness and the silicon layer in a second region has a second thickness less than the first thickness;
    forming a hard mask layer over the partially etched silicon layer;
    forming a first gate structure in the first region and a second gate structure in the second region, the first gate structure including the silicon layer having the first thickness and the second gate structure including the silicon layer having the second thickness;
    forming an interlayer dielectric (ILD) over the first and second gate structures;
    performing a chemical mechanical polishing (CMP) on the ILD that substantially stops at the silicon layer of the first gate structure, the CMP removing a portion of the hard mask layer of the second gate structure;
    removing the silicon layer from the first gate structure thereby forming a first trench;
    forming a first metal layer to fill in the first trench;
    removing the remaining portion of the hard mask layer and the silicon layer from the second gate structure thereby forming a second trench; and
    forming a second metal layer to fill in the second trench.

12. The method of claim 11, wherein the first metal layer is formed of a metal having a first type of work function and the second metal layer is formed of a metal having a second type of work function different from the first type of work function.

13. The method of claim 12, wherein the first gate structure is part of a pMOS device and the second gate structure is part of an nMOS device.

14. The method of claim 12, wherein the first gate structure is part of an nMOS device and the second gate structure is part of a pMOS device.

15. The method of claim 11, wherein a difference between the first thickness and the second thickness ranges from about 300 to about 400 angstrom (A).

16. A method for fabricating a semiconductor device, the method comprising:
    providing a semiconductor substrate having a first region and a second region;
    forming a first gate structure over the first region and a second gate structure over the second region, the first and second gate structures each including a high-k dielectric layer formed over the substrate, a silicon layer formed over the high-k dielectric layer, and a hard mask layer formed over the silicon layer, wherein the silicon layer of the first gate structure has a first thickness and the silicon layer of the second gate structure has a second thickness less than the first thickness;

forming an interlayer dielectric (ILD) over the first and second gate structures;

performing a chemical mechanical polishing (CMP) on the ILD that exposes the silicon layer of the first gate structure;

removing the silicon layer from the first gate structure thereby forming a first trench, wherein the hard mask layer of the second gate structure protects the silicon layer of the second gate structure from being removed;

forming a first metal layer to fill in the first trench;

removing the hard mask layer and the silicon layer from the second gate structure thereby forming a second trench; and forming a second metal layer to fill in the second trench.

17. The method of claim 16, wherein the forming the first gate structure and the second gate structure includes:

forming the high-k dielectric layer over the substrate;

forming the silicon layer over the high-k dielectric layer;

forming a patterned photoresist layer to protect the silicon layer in the first region;

etching a portion of the silicon layer in the second region;

removing the patterned photoresist layer;

forming the hard mask layer over the silicon layer;

patterning the hard mask layer, silicon layer, and high-k dielectric layer to form the first gate structure in the first region and the second gate structure in the second region.

18. The method of claim 16, wherein a difference between the first thickness and the second thickness ranges from about 300 to about 400 angstrom (A).

19. The method of claim 16, wherein the first metal layer includes a P-type work function metal and the second metal layer includes an N-type work function metal.

20. The method of claim 16, wherein the first metal layer includes an N-type work function metal and the second metal layer includes a P-type work function metal.

* * * * *